United States Patent [19]

Miyoshi et al.

[11] Patent Number: 5,498,874

[45] Date of Patent: Mar. 12, 1996

[54] DEFECT DETECTING APPARATUS AND METHOD

[75] Inventors: Motosuke Miyoshi, Tokyo, Japan; Katsuya Okumura, Poughkeepsie, N.Y.

[73] Assignee: Kabushiki Kaisha Toshiba, Kawasaki, Japan

[21] Appl. No.: 362,942

[22] Filed: Dec. 23, 1994

[30] Foreign Application Priority Data

Dec. 24, 1993 [JP] Japan .................... 5-328078

[51] Int. Cl.⁶ .................................... H01J 37/04
[52] U.S. Cl. .................. 250/397; 250/398; 250/492.2
[58] Field of Search ................... 250/397, 398, 250/492.2, 396 R

[56] References Cited

U.S. PATENT DOCUMENTS

| | | | |
|---|---|---|---|
| 4,075,488 | 2/1978 | Okayama et al. | 250/396 R |
| 4,469,950 | 9/1984 | Taylor et al. | 250/398 |
| 4,543,512 | 9/1985 | Nakasuji et al. | 250/397 |
| 4,804,851 | 2/1989 | Nixon . | |
| 5,036,209 | 7/1991 | Kataoka et al. | 250/398 |
| 5,362,968 | 11/1994 | Miyoshi et al. | 250/396 R |

OTHER PUBLICATIONS

J. Vac. Sci. Technol. B7 (6), Nov./Dec. 1989, pp. 1878–1881, A. D. Brodie, et al., "Energy Broadening of an Electron Optical Line Source".

*Primary Examiner*—Bruce C. Anderson
*Attorney, Agent, or Firm*—Oblon, Spivak, McClelland, Maier & Neustadt

[57] ABSTRACT

The fault detecting apparatus comprises an electro optical lens-barrel having a rectangular cathode (101), three four-pole lenses (117, 119, 121), and a deflector (129). The four-pole lenses are controlled to form such a rectangular beam that a ratio of a reduction ratio at the sample surface of an electron beam locus along a longitudinal direction of the rectangular cathode to a reduction ratio at the sample surface of an electron beam locus along a lateral direction of the rectangular cathode becomes equal to a ratio of a length to a width of the rectangular cathode and in addition a width of the beam is equal to a required minimum fault detection width. Further, the deflector (129) is controlled by a deflection controller (130) in such a way that the rectangular beam can be scanned (raster scanning) by moving the rectangular beam at every scanning stroke corresponding to the minimum fault detection width in both the longitudinal and lateral directions of the rectangular beam.

4 Claims, 6 Drawing Sheets

DEFECT DETECTING APPARATUS AND METHOD

BACKGROUND OF THE INVENTION

1. Field of the Invention

The present invention relates to a fault detecting apparatus and a fault detecting method, and more specifically to an apparatus and method of detecting pattern faults formed on a semiconductor wafer.

2. Description of the Prior Art

In the development and manufacturing process of ultra LSI circuits, for instance, the most basic method and an indispensable technique are to detect pattern faults formed un a semiconductor wafer and further to search the causes thereof in order to improve the production yield thereof.

In the above-mentioned fault detection, the dimensions of faults to be detected are determined on the basis of the minimum dimensions of a pattern to be detected. In general, it is necessary to detect faults less than ½ of the minimum pattern dimension. For instance, in the case of a 64 BM DRAM, since the minimum pattern size is 0.4 μm, the required detection sensitivity is 0.2 μm. Further, in the case of a 256 BM DRAM, since the minimum pattern size is 0.25 μm, the detection sensitivity as small as 0.1 μm will be required for the future.

In the field where the above-mentioned fault detection sensitivity is required, it is indispensable to use an electron beam. This is because the fault dimension to be detected exceeds the minimum resolution power of light.

The conventional method known as an electron optical system for generating a large-current micro-beam (beam diameter: about 0.1 μm) is to focus a beam emitted from a circular thermal cathode (considered as a point light source) into a circular beam by a reduction lens system. In this case, an effort has been made to obtain as large a current as possible by appropriately selecting the construction and the operating conditions (the reduction ratio, etc.) of the electro optical system.

In the electron optical system of symmetrical revolution, it is necessary to extract electrons from a narrow tip area of the cathode (considered as a point). However, the upper limit of the electron emission density from a point light source and the upper limit of the current obtained on the basis of the spacial charge effect are both limited.

To overcome this problem, various methods have been so far tried in the field of the electron beam exposure apparatus, for instance such that the tip diameter of the cathode of an electron gun is increased or that the cathode Lip is formed into a plane shape to increase the area from which electrons can be emitted. However, as far as these methods are basically combined with the conventional lens system of symmetrical revolution (electron optical lens-barrel), the characteristics of the electron emission density and the maximum current based upon the spacial charge effect in the vicinity of the cathode tip are inevitably restricted.

Further, when the electron beam is used, although it is possible to obtain a high spacial resolution and to improve the fault detection sensitivity, since the energy density of the electron beam to be used is small due to the limitation of the electron optical system, there exists a problem in that the S/N ratio (a ratio of signal to noise) of the signal detected from the pattern to be detected is lowered and in addition the detection time is relatively long.

As the fault detection for analyzing the defective pattern, a pattern comparison method is usually adopted. In this method, two images obtained from the same pattern are compared with each other. When both the detected patterns match each other, both the patterns are determined normal. However, when both do not match, either one of the patterns is determined defective (there exits at least one fault in the pattern).

The general method of comparing the two patterns is to compare pattern images obtained on the same pattern areas (observed pictures) of a chip (die) arranged on a semiconductor wafer, which is referred to as die-to-die method.

In the case where the same patterns are arranged as with the case of memory cells, an electron beam is scanned on the patterns, and the adjacent patterns are compared with each other in sequence. Since being simple and high in the detection speed, this method has been widely adopted recently.

Figure 1:
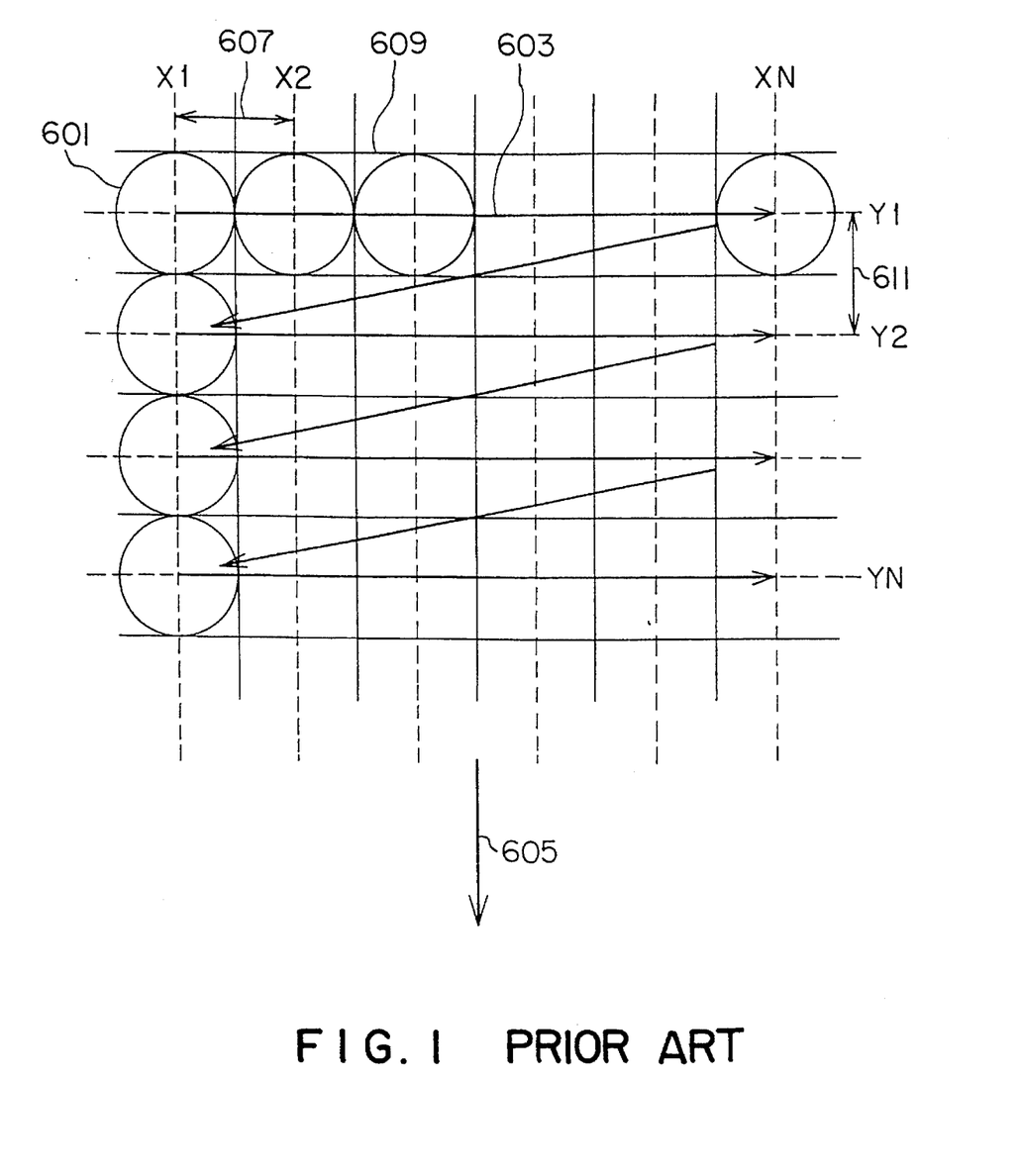
FIG. 1 is an illustration for assistance in explaining the conventional pattern scanning method by a circular beam.

FIG. 1 shows this fault detecting method (See P. Sandland et al., J. Vac. Sci. Technol. B9(6), Nov/Dec.. p. 3005, 1991). In FIG. 1, a circular beam 601 is scanned on patterns formed on a semiconductor wafer mounted on a stage (not shown). The circular beam 601 is scanned like a raster in the X direction as shown by an arrow 603, and further the stage is moved in the Y direction as shown by an arrow 605. Accordingly, the patterns are scanned in a rectangular shape. Here, if the detection sensitivity of 0.1 μm is required, the beam diameter is 0.1 μm. Further, the pattern signal can be detected from an area 609 corresponding to one pixel for each pitch 607 (e.g., 0.1 μm) in synchronism with the raster-scanning, so that an image can be formed. The scanning pitch 611 in the Y direction can be decided on the basis of the beam diameter, as 0.1 μm in this example. Further, in FIG. 1, X1, X2, ... XN are central positions of the respective pixels arranged in the X-axis direction, and Y1, Y2, ... YN are central positions of the respective pixels arranged in the Y-axis direction. These images detected at these pixels are compared with each other by use of an image processor to extract faults.

The inspection time can be decided on the basis of the scanning pitch determined by the beam diameter and the S/N ratio of the pattern signal at each pixel for forming an image. To inspect all the surface of the patterns on the semiconductor wafer, the scanning pitch becomes the beam diameter. For instance, when the fault detection sensitivity of 0.1 μm is required, the beam diameter is 0.1 μm and thereby the scanning pitch is also 0.1 μm. Therefore, the scanning pitch decreases with increasing detection sensitivity, with the result that the inspection time for detecting all the surface of the wafer increases.

On the other hand, the S/N ratio of the signal at each pixel is determined by the beam current rate, so that a large beam current rate is required to detect a fault with a sufficient contrast. However, in the case where objects whose Faults are to be detected are the patterns formed on a semiconductor wafer as described above, since the major part of each pattern is formed of an insulating substance, in order to prevent the pattern from being charged up by the irradiated electron beam, it is necessary to reduce the electron beam energy less than 1 KeV. However, when the electron beam energy is reduced, the aberration increases in the lens system for focusing the electron beam onto the semiconductor wafer. On the other hand, at a desired beam diameter, the beam current is inevitably lowered, so that the S/N ratio of the pattern signal at each pixel is also reduced and therefore the image contrast degrades.

Accordingly, to maintain the minimum detection sensitivity, it is necessary to increase the duration time of the beam irradiated upon each pixel by delaying the beam scanning time so as to obtain a sufficient current density of the electron beam at each pixel or to increase the S/N ratio by canning the same line of the pattern repeatedly and by processing the obtained signals for accumulative addition calculation. In any cases, however, the inspection time inevitably increases.

As described above, in order to obtain the detection sensitivity which exceeds the limit of the spacial resolution power of the optical system, although it is necessary to use an electron beam, as far as a circular beam is used to scan an object whose fault is to be detected, an extremely large current density is required in order to reduce the inspection time (to improve the throughput). However, when a sample whose fault is to be detected is an insulating substance such as a semiconductor wafer, the irradiation energy of the electron beam must be low, so that there exists a problem in that the inspection time is inevitably increased in order to improve the fault detection sensitivity by use of a low energy electron beam.

In addition, when both the fault detection sensitivity and the fault detection throughput contradictory to each other are required to obtain together, there exists another problem in that it is impossible to obtain a sufficient current density by the conventional electron optical system of symmetrical revolution.

SUMMARY OF THE INVENTION

Accordingly, it is the object of the present invention to provide a fault detecting apparatus and method, by which both the fault detection sensitivity and the throughput contradictory to each other can be compatible with each other, even in the case where a sample whose fault is to be detected must be irradiated with a low energy electron beam as with the case of a semiconductor wafer.

To achieve the above-mentioned object, the present invention provides a fault detecting apparatus for detecting a fault of a sample by scanning an electron beam upon a surface of the sample and by image processing obtained signals from the sample, which comprises: a rectangular cathode for generating an electron beam; a plurality of multi-pole lenses for focusing the generated electron beam onto the surface of the sample; first control means for controlling a plurality of said multi-pole lenses to obtain such a rectangular beam that a ratio of a reduction ratio at the sample surface of an electron beam locus along a longitudinal direction of said rectangular cathode to a reduction ratio at the sample surface of an electron beam locus along a lateral direction of said rectangular cathode becomes equal to a ratio of a length to a width of said rectangular cathode and in addition a width of the rectangular beam is equal to a required minimum fault detection width; a deflector for scanning the rectangular beam upon the sample surface; and second control means for controlling said deflecting means in such a way that the rectangular beam can be scanned on the sample surface by moving the rectangular beam at every scanning stroke corresponding to the minimum fault detection width in both the longitudinal and lateral directions of the rectangular beam.

Further, the present invention provides a fault detecting method of detecting a fault of a sample by scanning an electron beam generated by a rectangular cathode upon a surface of the sample and by image processing obtained signals from the sample, which comprises the steps of: forming such a rectangular electron beam that a ratio of a reduction ratio at the sample surface of an electron beam locus along a longitudinal direction of the rectangular cathode to a reduction ratio at the sample surface of an electron beam locus along a lateral direction of the rectangular cathode becomes equal to a ratio of a length to a width of the rectangular cathode and in addition a width of the beam is equal to a required minimum fault detection width; and scanning the rectangular electron beam by moving the rectangular electron beam at every scanning stroke corresponding to the minimum fault detection width in both the longitudinal and lateral directions of the rectangular beam.

Here, the step of forming the rectangular electron beam further comprises preferably a step of setting a current density of the rectangular electron beam to a value obtained by multiplying a current density of a circular beam having a diameter the same as the width of the rectangular beam by the ratio of the length to the width of the rectangular beam.

Further, it is preferable that the fault scanning method further comprises the steps of: detecting a plurality of signals each corresponding to the minimum image processing unit determined according to the ratio of the length to the width of the rectangular beam simultaneously, for every scanning of the rectangular beam in the beam longitudinal direction; accumulating a plurality of the detected signals to generate a first signal representative of a detected signal at a central position of the rectangular beam in the beam longitudinal direction on the sample surface; forming a second signal by averaging the detected signals at the central position of the sample surface; and detecting a fault of the sample by synthesizing the first and second signals and further by image processing the synthesized signal.

In the fault detecting apparatus and method according to the present invention, the electron beam generated from the rectangular cathode is controlled by a plurality of multi-pole lenses in such a way that a ratio of a reduction ratio at the sample surface of an electron beam locus along a longitudinal direction of the rectangular cathode to a reduction ratio at the sample surface of an electron beam locus along a lateral direction of the rectangular cathode becomes equal to a ratio of a length to a width of the rectangular cathode and in addition a width of the beam is equal to a required minimum fault detection width. Further, the electron beam is scanned by moving the rectangular beam at every scanning stroke corresponding to the minimum fault detection width in both the longitudinal and lateral directions of the rectangular beam.

Therefore, a sufficient current can be obtained by an rectangular beam extending in the longitudinal direction thereof, and in addition a high resolution power decided by the width of the rectangular beam can be obtained.

DETAILED DESCRIPTION OF THE PREFERRED EMBODIMENTS

The embodiment of the fault detecting apparatus and method according to the present invention will be described hereinbelow with reference to the attached drawings.

Figure 2:
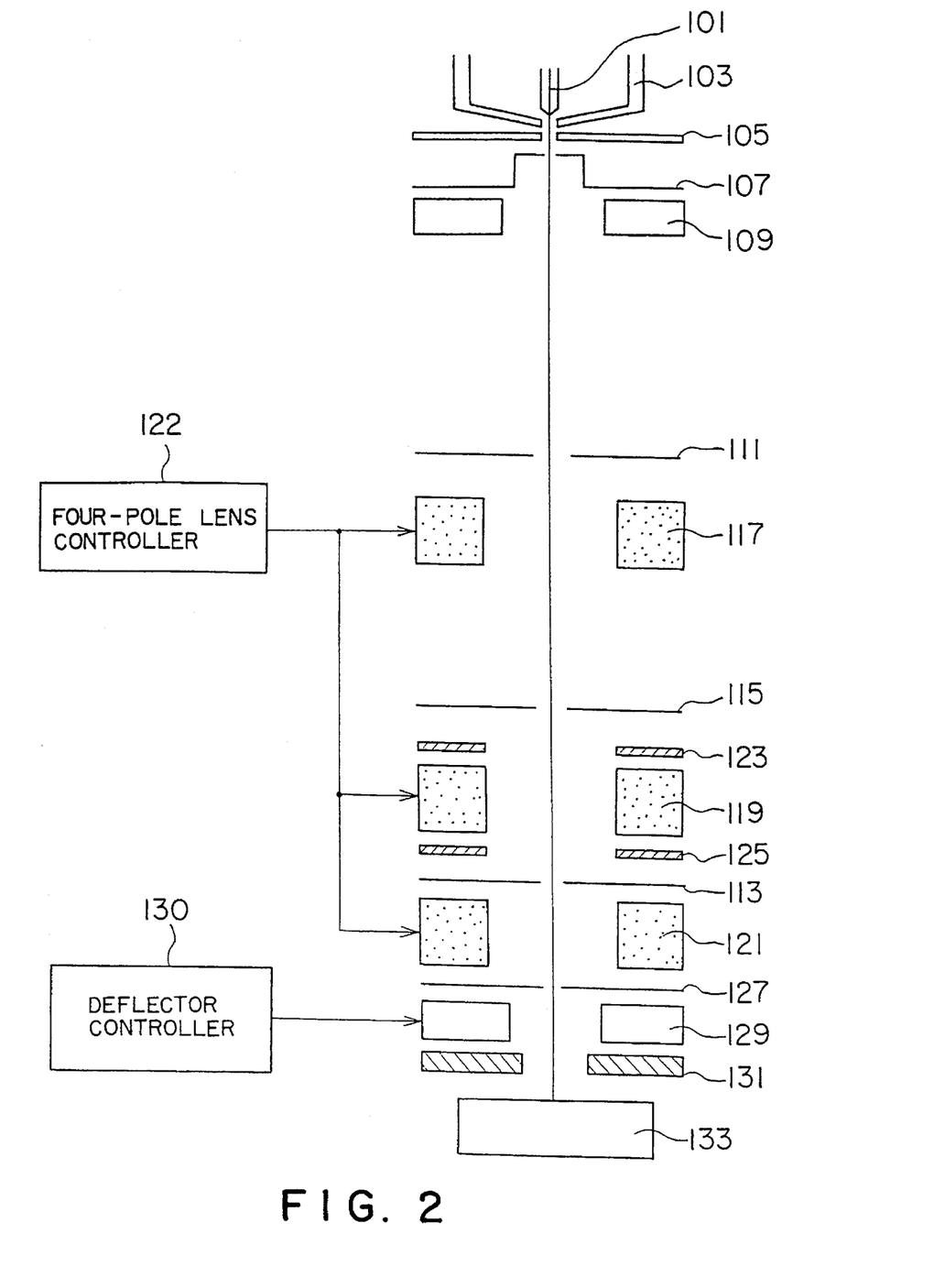
FIG. 2 is a schematic block diagram showing an electron optical lens-barrel incorporated in the fault detecting apparatus according to the present invention.

FIG. 2 shows the construction of an electron optical lens-barrel of the pattern fault detecting apparatus according to the present invention. Here, the apparatus for processing image signals obtained from a semiconductor wafer is not shown and the description thereof is omitted herein, because the used image signal processing apparatus is conventional and therefore well known in the art.

A rectangular cathode 101 for generating thermal electrons is of thermal cathode formed of lanthanum hexaboron ($L_aB_6$). This material is excellent in the processability (or workability) and large in emission current density. Further, without being limited to only $L_aB_6$, it is also possible to use tungsten (W) or zirconium oxide tungsten (ZrO/W).

Figure 3A:
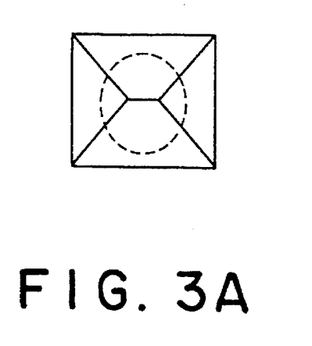
FIG. 3A is an top view showing a rectangular cathode used for the fault detecting apparatus according to the present invention.
Figure 3B:
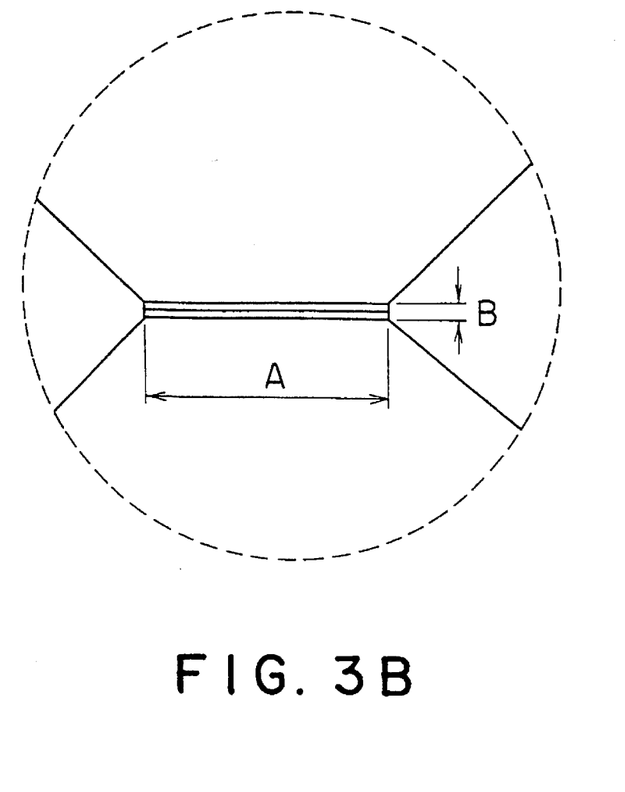
FIG. 3B is an enlarged view showing only an area enclosed by a dashed line circle shown in FIG. 3A.

FIGS. 3A and 3B show the end view showing a tip of the rectangular cathode 101, in which FIG. 3B is an enlarged view showing an area enclosed by a dashed circle shown in FIG. 3A. As shown, the tip of the rectangular cathode 101 is formed into a rectangular shape having a length A and a width B in the (100) orientation plane.

In the case where the tip of the cathode 101 is processed into a rectangular shape, there exist various advantages as follows: the electron emission area is large as compared with a point cathode electrode; the influence of the spatial charge effect dependent upon the electron emission current density can be reduced; and since electrons can be emitted at a low energy less than 1 KeV, the charge up on the irradiation surface can be eliminated so that it is possible to prevent the electron beam from being expanded due to the spatial charge effect or to prevent the electron energy from being reduced due to the expansion.

In FIG. 2, a Wehnelt electrode 103 servers to control the electric field to an optimum shape in order to extract thermal electrons, and the extracted thermal electrons are generated through an anode 105. These rectangular cathode 101, the Wehnelt electrode 103 and the anode 105 constitute an electron gun.

A rectangular aperture stop 107 is an aperture for deciding an emission angle of emitted electrons. A four-pole deflector 109 aligns the electrons emitted from the electron gun so that the emitted electrons are corrected so as to coincide with the central axis of the lens system. A scattering prevention diaphragm 111, an X-axis correction diaphragm 113 and a Y-axis correction diaphragm 115 all serve to limit the incident angle of the electrons upon the lens system so that the aberration can be minimized.

An electric field type first four-pole lens 117, an electric field type second four-pole lens 119 and an electric field type third four-pole lens 121 constitute an optical lens system of an electron optical lens-barrel. That is, the electron beam can be restricted by a triple structure. In addition, as described later in detail, the four-pole lens is controlled into a rectangular beam by a four-pole lens controller 122.

A first aperture electrode 123 and a second aperture electrode 125 are used to correct the generated aberration. A beam restriction diaphragm 127 is an aperture for deciding the opening angle of the electron beam allowed to be incident upon a sample. An eight-electrode deflector 129 scans the rectangular electron beam like a raster on a sample under control of a deflector controller 130, as described in further detail later. Further, a micro-channel plate (MCP) detector 131 detects the secondary electrons emitted from a sample mounted on a stage 133. The detected secondary electrons are transmitted to an image processing apparatus (not shown) for fault detection.

Figure 4:
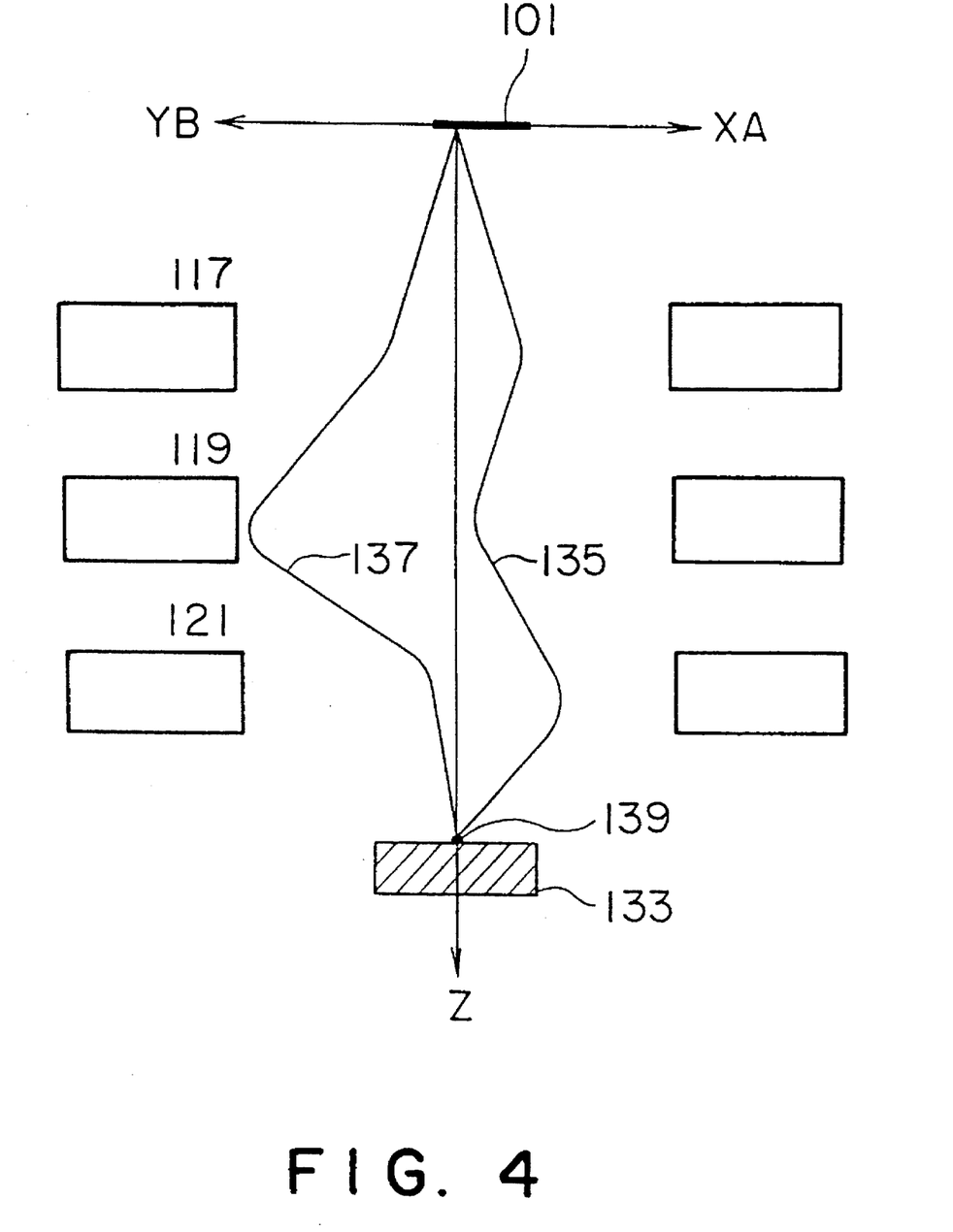
FIG. 4 is an illustration for assistance in explaining loci of an electron beam emitted from the rectangular cathode.

FIG. 4 shows loci of the electron beam allowed to be incident upon the sample from the pattern fault detecting apparatus according to the present invention. An XA axis is determined to be the same as the length direction A of the rectangular cathode 101 in FIG. 3B and a YB axis is determined to be the same as the width direction B of the rectangular cathode 101 also in FIG. 3B. An XA axis direction locus (a locus of electrons emitted on a cross section taken along the major axis direction A of the rectangular electrode 101) 135 and a YB axis direction locus (a locus of electrons emitted on a cross section taken along the minor axis direction B of the rectangular electrode 101) 137 intersect each other in an image formation plane 139 on a Z axis. Therefore, all the loci of the electrons emitted from the rectangular cathode 101 are included at an area enclosed between the XA locus 135 and the YB locus 137.

Here, when a ratio Mx/My of the reduction ratio Mx on the XA axis to the reduction ratio My on the YB axis matches an aspect ratio (a ratio of the length A to the width B) of the rectangular cathode 101, it is possible to focus the electron beam onto the image formation plane 139 at a ratio of 1 : 1, that is, into a circular beam. Under these conditions, it is possible to obtain a large beam current rate to such an extent that the influence of the spacial charge effect can be reduced markedly on the surface of the rectangular cathode 101. This is the first feature of the pattern fault detecting apparatus according to the present invention, which is provided with the electron optical lens-barrel composed of the rectangular cathode and the four-pole lens system as the major composing elements.

In the above-description, the reduction ratio indicates how small the emission area of the electrons emitted at the rectangular cathode 101 can be reduced on the image formation plane 139. Therefore, when the reduction ratio Mx on the XA axis is reduced, the shape of the beam focused on the image formation plane 139 becomes a rectangular shape long in the XA axis direction.

For instance, if the length A of the rectangular cathode 101 is 100 μm and the width B thereof is 10 μm, in order to obtain a circular beam with a diameter of 0.1 μm, it is necessary that $Mx=10^{-3}$, and $My=10^{-2}$. However if $Mx=10^{-2}$, it is possible to obtain a rectangular beam (a first rectangular beam) of 1 μm (in length)×0.1 μm (in width). The beam focusing condition for obtaining a circular beam in Mx ≠My is referred to as being pseudo-stigmatic, and the beam focusing condition for obtaining a rectangular beam at the same aspect ratio as the cathode in Mx=My is referred to as being stigmatic, respectively.

The method of operating the four-pole lenses 117, 119 and 121 with the four-pole lens controller 122 so that the rectangular beam as described above can be formed will be described hereinbelow.

In the paraxial equation of an electron beam through an electric field four-pole lens, as far as the length of the four-pole lens is sufficiently large as compared with the opening a, in general the electric field distribution k(z) is approximated by a rectangular model, as expressed below:

$$X'' - \beta^2 k(z) x = 0$$
$$Y'' + \beta^2 k(z) y = 0 \quad (1)$$

where $\beta^2 = V_2/V_a a^2$ and $V_2$ denotes the voltage applied to the electrode; and $V_a$ denotes the acceleration voltage. Further, X denotes the distance in the XA direction in FIG. 4; X" denotes the twice differential of X; Y denotes the distance in the YB direction in FIG. 4; and Y" denotes the twice differential of Y.

Further, the paraxial characteristics of the four-pole lens will be explained below. The electron beam locus in the four-pole rectangular distribution field can be expressed by the following formulae, where the X direction distance of the electron beam at the beam incoming end plane of the rectangular field is denoted by $X_0$; the gradient thereof in the X direction is denoted by $X_0'$; the Y direction distance of the electron beam at the beam incoming end plane of the rectangular field is denoted by $Y_0$; and the gradient thereof in the Y direction is denoted by $Y_0'$:

$$X = X_0 \cosh\beta z + X_0' \sinh\beta z/\beta$$
$$Y = Y_0 \sin\beta z + Y_0' \sin\beta z/\beta \quad (2)$$

Therefore, the loci $(X_L, X_L', Y_L, Y_L')$ at the beam outgoing end plane of the rectangular field can be expressed by the following matrices:

$$\begin{pmatrix} X_L \\ X_L' \end{pmatrix} = T_D \begin{pmatrix} X_0 & Y_L \\ X_0' & Y_L' \end{pmatrix} = T_C \begin{pmatrix} Y_0 \\ Y_0' \end{pmatrix} \quad (3)$$

$$T_D = \begin{pmatrix} \cosh\theta & 1/\beta \sinh\theta \\ \beta\sin\theta & \cosh\theta \end{pmatrix}$$

$$T_C = \begin{pmatrix} \cos\theta & 1/\beta \sin\theta \\ -\beta\sin\theta & \cos\theta \end{pmatrix} \quad \theta = \beta L$$

In the formulae (3) above, θ denotes a parameter representative of the exciting condition of each of the four-pole lenses.

Further, when the four-pole lenses 117, 119 and 121 are combined at three stages (into a triplet structure) as with the case of the present invention, the loci in the end plane of the final stage lens of the optical system can be expressed by the following matrices:

$$\begin{pmatrix} X \\ X' \end{pmatrix} = (T_{C3}) \begin{pmatrix} 1 & s_2 \\ 0 & 1 \end{pmatrix} (T_{D2}) \begin{pmatrix} 1 & s_1 \\ 0 & 1 \end{pmatrix} (T_{C1}) \begin{pmatrix} 1 & a & X_0 \\ 0 & 1 & X_0' \end{pmatrix} \quad (4)$$

$$\begin{pmatrix} Y \\ Y' \end{pmatrix} = (T_{D3}) \begin{pmatrix} 1 & s_2 \\ 0 & 1 \end{pmatrix} (T_{C2}) \begin{pmatrix} 1 & s_1 \\ 0 & 1 \end{pmatrix} (T_{D1}) \begin{pmatrix} 1 & a & Y_0 \\ 0 & 1 & Y_0' \end{pmatrix}$$

In the above formulae (4), a denotes the distance between the rectangular cathode 101 and the beam incoming end plane of the first four-pole lens 117; $s_1$ denotes the distance between the first four-pole lens 117 and the second four-pole lens 119; and $s_2$ denotes the distance between the second four-pole lens 119 and the four-pole lens 121.

Further, in FIG. 4, under the focusing conditions, since the XA direction locus and the YB direction locus both match each other in an image forming plane 139 on the Z axis and further that the reduction ratio of the XA direction locus and the reduction patio of the YB direction locus are equal to each other (stigmatic condition), the focusing conditions can be expressed as follows:

$$X/Y = Y/Y'(Mx = My) \quad (5)$$

That is, since the reduction ratios are equal to each other in both the XA and YB directions in order to focus the electron beam emitted from the rectangular cathode into a rectangular beam, it is possible to form an image under stigmatic condition.

In general, the beam diameter is decided by the aberration, in particular by chromatic aberration. Further, the maximum beam current is determined by the characteristics of the electron gun, in particular by the beam opening angle which can be set. Since the four-pole lens system is asymmetrical lens system, it is possible to design the respective set various conditions such as the reduction ratio, the aberration, and the opening angle, in both the XA axis and the YB axis independently.

When the electrons emitted from the rectangular cathode 101 is focused into a circular beam, since the reduction ratio 101 is focused into a circular beam, since the reduction ratio Mx in the XA (major) axis direction is large (one order than that My), the electron beam diameter is determined only by the aberration in the XA direction, and in addition the maximum beam current is limited by the beam opening angle determined by this aberration.

In the case where the electrons emitted from the rectangular cathode 101 are focused into a rectangular beam, the above-mentioned conditions can be relaxed markedly. The stigmatic focusing conditions will be explained hereinbelow as the typical example of the relaxation conditions. In this case, the beam focusing conditions are $Mx = My = 10^{-2}$. Here, since the reduction ratio in the XA (major) axis direction can be reduced by 1/10 as compared with the circular beam, the chromatic aberration in the XA axis direction can be improved about 10 times (because the chromatic aberration coefficient can be reduced 1/10), as compared with the case of the circular beam. As a result, it is possible to set the opening angle in the cathode plane to be larger by 10 times.

The above-mentioned relationship will not be established at all times. However, this relationship can be sufficiently established in the case where a high reduction ratio (one/several tens) is set to form a micro-beam.

Therefore, when a rectangular beam is formed, since the area of the beam is 10 times larger than that of a circular beam, the total current rate can be increased by 100 times and thereby the beam current density can be increased by 10 times larger than that of the circular beam. The above-mentioned fact is the second feature of the pattern fault detecting apparatus according to the present invention, which is provided with the electron optical lens-barrel composed of the rectangular cathode and the four-pole lens system as the major composing elements.

The method of scanning the rectangular beam and processing the image signal related thereto in order to improve the throughput of the pattern fault detecting apparatus according to the present invention will be explained hereinbelow.

Figure 5:
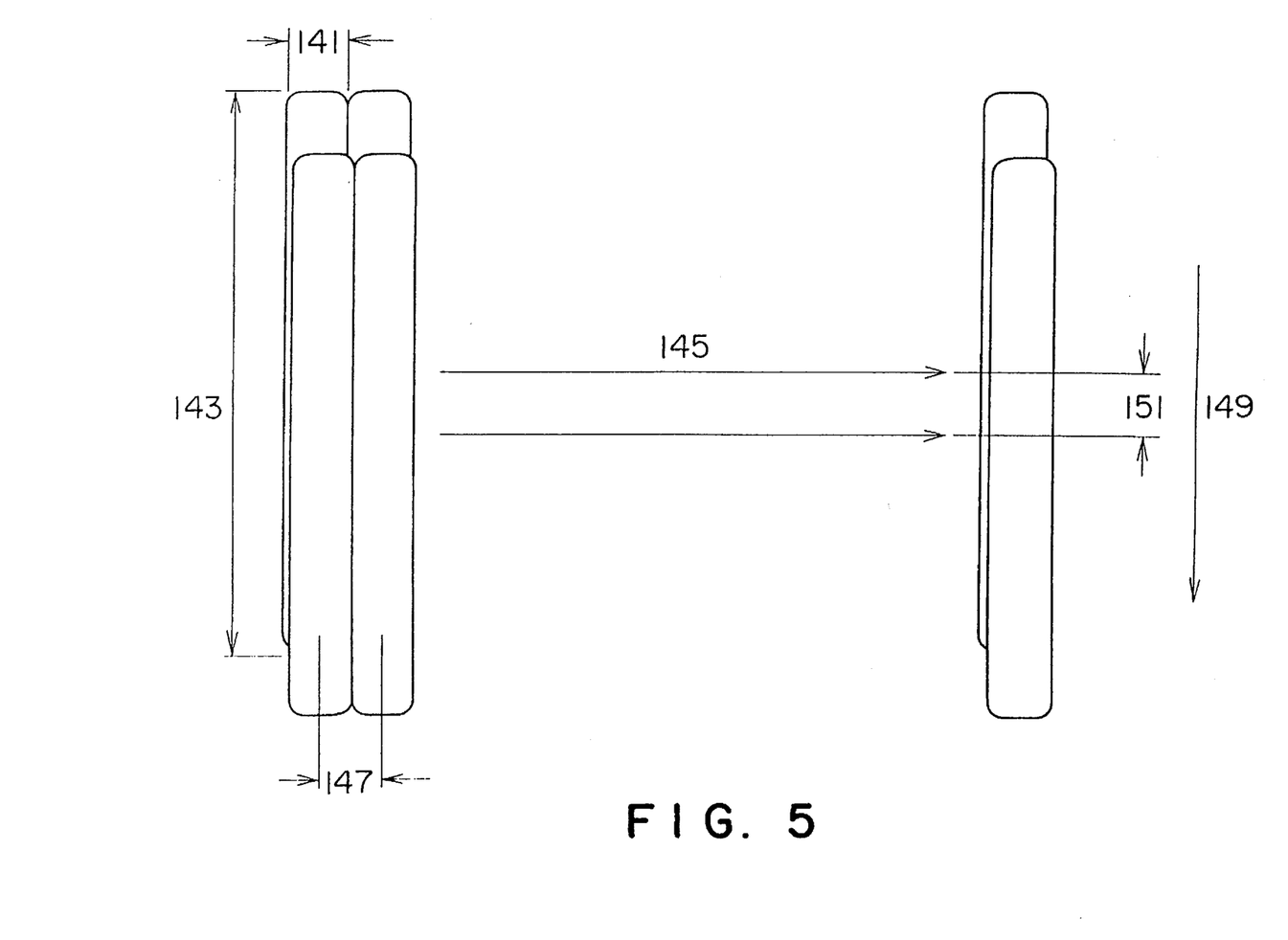
FIG. 5 is an illustration for assistance in explaining the scanning method by use of the rectangular beam in the fault detecting method according to the present invention.

By controlling the electric field four-pole lenses 117, 119 and 121 shown in FIG. 4 by the four-pole lens controller 122 shown in FIG. 2, as shown in FIG. 5, the width 141 of the rectangular beam is set to such a size as to correspond to the minimum detection sensitivity required to obtain (a second rectangular beam). For instance, when a detection sensitivity of 0.1 μm is required, the beam diameter of the circular beam is 0.1 μm, so that the width of the rectangular beam is also 0.1 μm. Further, the length of the rectangular beam is set to any given aspect N (the ratio of length of width). This aspect ratio N can be determined freely within a range where the opening angle can be set large due to a decrease of the reduction ratio as compared with the circular beam and consequently the current density can be increased to that extent. Here, the aspect ratio is determined as N=9. Therefore, the size of the rectangular beam is 0.9 μm in length and 0.1 μm in width.

By controlling the eight-pole deflector 129 by the deflector controller 130 shown in FIG. 2, the rectangular beam is scanned on the sample in the direction 145 of width 141 in FIG. 5, and signals are detected from the sample at each pitch 147 (at every scanning stroke) of 0.1 μm in synchronism with the beam scanning speed. The rectangular beam is moved in the direction 149 of the length 143 of the rectangular beam by moving a stage (not shown), in the same way as with the case of the prior art apparatus. In this case, the pitch 151 is also 0.1 μm, so that the size of the pixel to be processed is 0.1 μm square.

Figure 6:
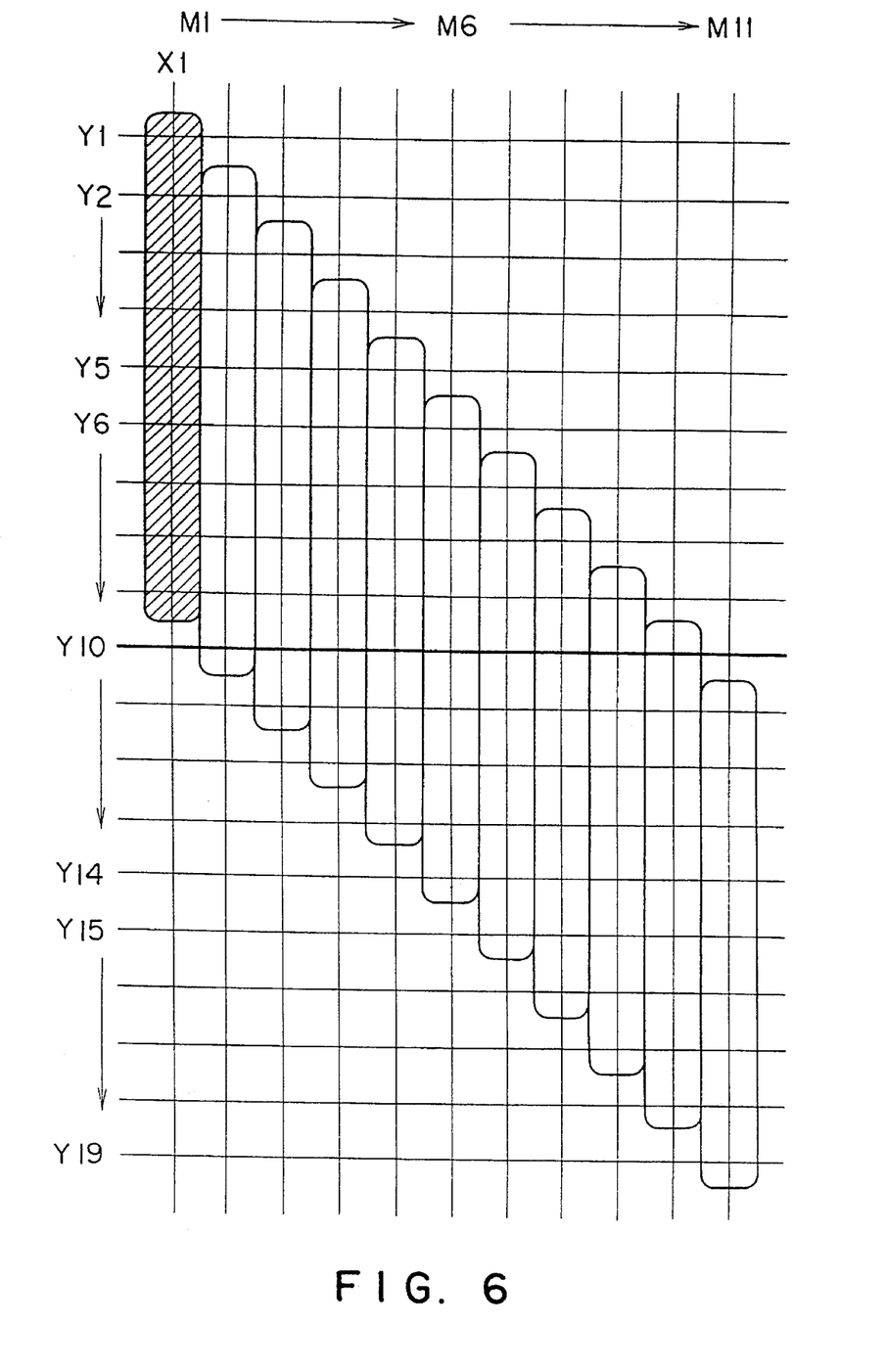
FIG. 6 is a graphical representation showing the scanning method by the rectangular beam in the fault detecting method according to the present invention.

FIG. 6 shows the relationship between the rectangular beam and the scanning pitch. Here, when the movement of the rectangular beam in the direction 145 of the width 141 of the rectangular beam (in FIG. 5) is always fixed on the axis X1 (in FIG. 6) (for convenience of explanation), the rectangular beam movement in the direction 149 of the beam length 143 (in FIG. 5) is shifted from the axis Y1 to the axis Y19. In practice, on the other hand, the rectangular beam is scanned in the Y axis direction being shifted in sequence for each pitch from M1 to M11 in FIG. 6.

Here, the method of scanning the rectangular beam and of processing the image signals obtained by the pattern fault detecting apparatus according to the present invention will be explained hereinbelow on the assumption that there exists a fault of 0.1 μm at the coordinates (X1, Y10) in FIG. 6.

The pattern fault detection is executed on the basis of the sequential comparison method in the same way as with case of the conventional apparatus. In the case of a convex fault (a fault portion projects as when dust adheres onto a sample surface), the signal level obtained at the fault portion is becomes high. On the other hand, in the case of a concave fault (as when a metallic wiring pattern is absent), the signal level obtained at the fault portion is becomes low, as compared with the normal signal level. Therefore, the signal level changes according to the presence or absence of faults. The image information data obtained at the same block of the same pattern are compared with each other, and the normal pattern information data are removed through the comparison processing, to extract only the fault signals.

As described above, since the aspect ratio is determined N=9 and thereby the size of the rectangular beam is determined 0.9 μm in length and 0.1 μm in width, it is possible to detect the image signals corresponding to 9 pixels at the same time by the beam scanning at a single sampling, when considered in unit of pixel of the circular beam. For instance, at the beam scanning position of M1 shown in FIG. 6, the image signals are obtained as an accumulative value of 9 pixels from Y1 to Y9. The rectangular beam coordinates at this time ape considered as (X1, Y5). In other words, at the M1 beam scanning position, the beam coordinates are assumed as (X1, Y5).

The obtained signals are detected as the pixel signals at the central position coordinates. That is, at the beam scanning position of M1, that is, at the coordinates (X1, Y5) of the rectangular beam, the accumulative values of the signals from the coordinates (X1, Y1) to the coordinates (X1, Y9) are detected as the signal values at the coordinates (X1, Y5).

After that, the signals from the coordinates (X1, Y1) to (X1, Y9) are added and averaged and further detected again as the signal value at the coordinates (X1, YS). This addition average processing is effective to remove noise generated as random. In this case, although the rectangular beam is scanned and therefore the current density can be increased by the aspect times N, the S/N ratio can be reduced by $N^{1/2}$ times. This is because the major parts of the noise generated by the electron beam apparatus are shot noise. Further, the shot noise is usually generated in proportion to the root of the beam current, so that when the beam current increases by N times, although the signal level can be increased by N times, an increase of noise can be suppressed to an increase of $N^{1/2}$ times.

As described above, the image signal at the coordinates (X1, Y5) can be obtained by synthesizing the accumulative signals and the addition average signal obtained as described above.

At the central coordinates (X1, Y5) of the beam, since the beam does not reach the fault position coordinates (X1, Y10), no fault signal can be detected. However, when the beam scanning position is shifted to the position M2 and thereby the central coordinates of the beam reaches the coordinates (X1, Y6), since the beam reaches the coordinates (X1, Y10), the detection signal contains the fault signal. Further, the fault signal is kept detected, until the beam scanning position is shifted to the position M1 and thereby the central coordinates of the beam reaches the coordinates (X1, Y14). That is, when the beam scanning position moves to the position M11 and thereby the central coordinates of the beam reaches the coordinates (X1, Y15), no fault signal is not detected.

In the signal processing method as described above, since the S/N ratio of the image signals obtained by irradiating the rectangular beam is increased by $N^{1/2}$ times, the duration time of the beam irradiated upon one pixel can be reduced by $1/N^{1/2}$ times, as compared when a fault is detected by a circular beam at the same S/N ratio, so that the throughput (the inspection time) can be improved to that extent.

As explained in detail above, in the fault detecting apparatus and method according to the present invention, since the electron beam generated by a rectangular cathode is controlled through the multi-pole lens system and further the generated rectangular beam is shifted at every scanning stroke (which corresponds to the minimum fault detection width) in the longitudinal (Y) direction of the rectangular beam and further in the transversal direction (M) of the rectangular beam, it is possible to obtain an electron beam low in energy but large in the current density (in spite of the low energy), as compared with the circular beam having the same diameter as the width of the rectangular beam, with the result that it is possible to detect an image signal of high S/N ratio in spite of a short inspection time.

What is claimed is:

1. A fault detecting apparatus for detecting a fault of a sample by scanning an electron beam upon a surface of the sample and by image processing obtained signals from the sample, which comprises:

a rectangular cathode for generating an electron beam;

a plurality of multi-pole lenses for focusing the generated electron beam onto the surface of the sample;

first control means for controlling a plurality of said multi-pole lenses to obtain such a rectangular beam that a ratio of a reduction ratio at the sample surface of an electron beam locus along a longitudinal direction of said rectangular cathode to a reduction ratio at the sample surface of an electron beam locus along a lateral direction of said rectangular cathode becomes equal to a ratio of a length to a width of said rectangular cathode and in addition a width of the rectangular beam is equal to a required minimum fault detection width;

a deflector for scanning the rectangular beam upon the sample surface; and second control means for controlling said deflecting means in such a way that the rectangular beam can be scanned on the sample surface by moving the rectangular beam at every scanning stroke corresponding to the minimum fault detection width in both the longitudinal and lateral directions of the rectangular beam.

2. A fault detecting method of detecting a fault of a sample by scanning an electron beam generated by a rectangular cathode upon a surface of the sample and by image processing obtained signals from the sample, which comprises the steps of:

forming such a rectangular electron beam that a ratio of a reduction ratio at the sample surface of an electron beam locus along a longitudinal direction of the rectangular cathode to a reduction ratio at the sample surface of an electron beam locus along a lateral direction of the rectangular cathode becomes equal to a ratio of a length to a width of the rectangular cathode and in addition a width of the beam is equal to a required minimum fault detection width; and scanning the rectangular electron beam by moving the rectangular electron beam at every scanning stroke corresponding to the minimum fault detection width in both the longitudinal and lateral directions of the rectangular beam.

3. The fault scanning method of claim 2, wherein the step of forming the rectangular electron beam further comprises a step of setting a current density of the rectangular electron beam to a value obtained by multiplying a current density of a circular beam having a diameter the same as the width of the rectangular beam by the ratio of the length to the width of the rectangular beam.

4. The fault scanning method of claim 3, which further comprises the steps of:

detecting a plurality of signals each corresponding to the minimum image processing unit determined according to the ratio of the length to the width of the rectangular beam simultaneously, for every scanning of the rectangular beam in the beam longitudinal direction;

accumulating a plurality of the detected signals to generate a first signal representative of a detected signal at a central position of the rectangular beam in the beam longitudinal direction on the sample surface;

forming a second signal by averaging the detected signals at the central position of the sample surface; and detecting a fault of the sample by synthesizing the first and second signals and further by image processing the synthesized signal.

\* \* \* \* \*